United States Patent
Kim et al.

(10) Patent No.: US 9,437,790 B2
(45) Date of Patent: *Sep. 6, 2016

(54) POLYESTER RESIN COMPOSITION HAVING GOOD YELLOWING RESISTANCE AND IMPACT RESISTANCE

(71) Applicant: Cheil Industries Inc., Gumi-si (KR)

(72) Inventors: Pil Ho Kim, Uiwang-si (KR); In Sik Shim, Uiwang-si (KR); Jong Cheol Lim, Uiwang-si (KR); Sun Ho Song, Uiwang-si (KR); Sang Hwa Lee, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 54 days.

This patent is subject to a terminal disclaimer.

(21) Appl. No.: 14/367,416

(22) PCT Filed: Dec. 26, 2012

(86) PCT No.: PCT/KR2012/011485
§ 371 (c)(1),
(2) Date: Jun. 20, 2014

(87) PCT Pub. No.: WO2013/100578
PCT Pub. Date: Jul. 4, 2013

(65) Prior Publication Data
US 2014/0350163 A1   Nov. 27, 2014

(30) Foreign Application Priority Data

Dec. 28, 2011  (KR) .................. 10-2011-0144409
Dec. 28, 2011  (KR) .................. 10-2011-0144429
Dec. 24, 2012  (KR) .................. 10-2012-0152533

(51) Int. Cl.
*B60C 1/00* (2006.01)
*C08K 3/22* (2006.01)
*H01L 33/60* (2010.01)
*C08L 67/02* (2006.01)

(52) U.S. Cl.
CPC ............... *H01L 33/60* (2013.01); *C08L 67/02* (2013.01); *H01L 2933/0058* (2013.01)

(58) Field of Classification Search
CPC ........ C08L 67/02; C08L 23/02; H01L 33/60; H01L 2933/0058; C08K 3/0033; C08K 3/22
USPC ........................................................ 524/494
See application file for complete search history.

(56) References Cited

U.S. PATENT DOCUMENTS

| | | | |
|---|---|---|---|
| 4,006,272 A | 2/1977 | Sakaguchi et al. | |
| 4,027,073 A | 5/1977 | Clark | |
| 4,034,013 A | 7/1977 | Lane | |
| 4,045,514 A | 8/1977 | Iwahashi et al. | |
| 4,139,600 A | 2/1979 | Rollmann et al. | |
| 4,180,494 A | 12/1979 | Fromuth et al. | |
| 4,287,315 A | 9/1981 | Meyer et al. | |
| 4,303,772 A | 12/1981 | Novicky | |
| 4,393,153 A | 7/1983 | Hepp | |
| 4,400,333 A | 8/1983 | Neefe | |
| 4,664,983 A * | 5/1987 | Nakamura et al. | 428/458 |
| 4,694,031 A | 9/1987 | Morita et al. | |
| 4,745,029 A | 5/1988 | Kambour | |
| 4,753,980 A * | 6/1988 | Deyrup | 524/369 |
| 4,788,251 A | 11/1988 | Brown et al. | |
| 4,803,235 A | 2/1989 | Okada | |
| 4,900,610 A * | 2/1990 | Hochberg et al. | 428/195.1 |
| 4,906,202 A | 3/1990 | Germ | |
| 4,906,696 A | 3/1990 | Fischer et al. | |
| 5,025,066 A | 6/1991 | DeRudder et al. | |
| 5,061,558 A | 10/1991 | Fischer et al. | |
| 5,068,285 A | 11/1991 | Laughner | |
| 5,124,402 A | 6/1992 | Laughner et al. | |
| 5,189,091 A | 2/1993 | Laughner | |
| 5,200,492 A | 4/1993 | Ohnaga et al. | |

(Continued)

FOREIGN PATENT DOCUMENTS

CN   1285858 A    2/2001
DE   19845317 A1  4/2000

(Continued)

OTHER PUBLICATIONS

Poly(cyclohexanedimethylene terephthalate), pp. 1-2, obtained online from http://www.polymerprocessing.com/polymers/PCT.html. No publication date given.*
English language translation of WO 20100143796.*
International Search Report in counterpart International Application No. PCT/KR2012/011485 dated Apr. 16, 2013, pp. 1-4.
Taiwanese Office Action in commonly owned Taiwanese Application No. 96136059 issued on May 5, 2011, pp. 1-9.
English Translation of Taiwanese Office Action in commonly owned Taiwanese Application No. 96136059 issued on May 5, 2011, pp. 1-5.
European Search Report in commonly owned European Application No. 07808474 dated Sep. 28, 2011, pp. 1-4.
International Preliminary Report on Patentability in commonly owned International Application No. PCT/KR2007/004743, dated Mar. 31, 2009, pp. 1-5.

(Continued)

*Primary Examiner* — Alexander Kollias
(74) *Attorney, Agent, or Firm* — Additon, Higgins & Pendleton, P.A.

(57) ABSTRACT

The polyester resin composition of the present invention is characterized by comprising: (A) 100 parts by weight of a high heat resistant polyester resin having a main chain formed by a structure derived from aromatic dicarboxylic acid and alicyclic diol, wherein the melting point of the high heat resistant polyester resin is 200° C. or more; (B) 0.1 to 80 parts by weight of white pigment; and (C) 1 to 40 parts by weight of polyolefin copolymer. The resin composition of the present invention further comprises 1 to 40 parts by weight of a high stiffness polyester resin having a main chain comprising a structure derived from aromatic dicarboxylic acid and aliphathic diol. The molding foam, which is obtained from the polyester resin composition and the manufactured polyester resin composition, has good flexibility, heat resistance, and yellowing resistance and can be used for an LED reflecting plate due to having improved impact strength.

21 Claims, No Drawings

(56) References Cited

U.S. PATENT DOCUMENTS

| | | | |
|---|---|---|---|
| 5,219,915 A | 6/1993 | McKee et al. | |
| 5,242,967 A | 9/1993 | Minnick | |
| 5,280,070 A | 1/1994 | Drzewinski et al. | |
| 5,284,916 A | 2/1994 | Drzewinski | |
| 5,292,809 A | 3/1994 | Drzewinski et al. | |
| 5,308,894 A | 5/1994 | Laughner | |
| 5,369,154 A | 11/1994 | Laughner | |
| 5,382,628 A * | 1/1995 | Stewart et al. | 525/174 |
| 5,441,997 A | 8/1995 | Walsh et al. | |
| 5,449,557 A | 9/1995 | Liebler et al. | |
| 5,470,658 A | 11/1995 | Gasca et al. | |
| 5,529,716 A | 6/1996 | Nomura et al. | |
| 6,060,538 A | 5/2000 | Gallucci | |
| 6,252,002 B1 | 6/2001 | Yamada et al. | |
| 6,310,129 B1 * | 10/2001 | Lilly et al. | 524/424 |
| 6,486,251 B1 | 11/2002 | Patel | |
| 6,545,089 B1 | 4/2003 | DeRudder et al. | |
| 6,646,068 B2 | 11/2003 | Chisholm et al. | |
| 6,653,391 B1 | 11/2003 | Weber et al. | |
| 7,294,659 B2 | 11/2007 | Yatake | |
| 7,385,013 B2 | 6/2008 | Kobayashi et al. | |
| 7,732,515 B2 | 6/2010 | Jang et al. | |
| 7,960,464 B2 | 6/2011 | Kobayashi et al. | |
| 8,044,143 B2 | 10/2011 | Park et al. | |
| 2002/0042483 A1 | 4/2002 | Vanderbilt | |
| 2002/0111409 A1 * | 8/2002 | Talibuddin | 524/417 |
| 2003/0032725 A1 | 2/2003 | Gaggar et al. | |
| 2005/0159533 A1 | 7/2005 | Nabeshima et al. | |
| 2005/0165207 A1 * | 7/2005 | Agarwal et al. | 528/272 |
| 2005/0239949 A1 | 10/2005 | Nakamura et al. | |
| 2006/0004154 A1 | 1/2006 | DeRudder et al. | |
| 2006/0030647 A1 | 2/2006 | Ebeling et al. | |
| 2006/0051587 A1 | 3/2006 | Mori et al. | |
| 2006/0100307 A1 | 5/2006 | Uerz et al. | |
| 2006/0135690 A1 | 6/2006 | Juikar et al. | |
| 2007/0155913 A1 * | 7/2007 | Chakravarti et al. | 525/439 |
| 2007/0213458 A1 * | 9/2007 | Topoulos | 524/601 |
| 2007/0265371 A1 | 11/2007 | Takahashi et al. | |
| 2008/0009571 A1 | 1/2008 | Pixton et al. | |
| 2008/0153954 A1 | 6/2008 | Arpin | |
| 2008/0242789 A1 | 10/2008 | Zhu et al. | |
| 2009/0080079 A1 | 3/2009 | Kogure et al. | |
| 2009/0118402 A1 | 5/2009 | Jang et al. | |
| 2009/0209696 A1 | 8/2009 | Lee et al. | |
| 2009/0215934 A1 * | 8/2009 | Nakamura et al. | 524/115 |
| 2009/0275678 A1 | 11/2009 | Kumazawa et al. | |
| 2010/0029855 A1 | 2/2010 | Matsuoka et al. | |
| 2010/0113648 A1 | 5/2010 | Niessner et al. | |
| 2010/0152357 A1 | 6/2010 | Kwon et al. | |
| 2010/0160529 A1 | 6/2010 | Lee et al. | |
| 2010/0160532 A1 | 6/2010 | Park et al. | |
| 2010/0168272 A1 | 7/2010 | Park et al. | |
| 2010/0197827 A1 | 8/2010 | Kim et al. | |
| 2010/0240831 A1 | 9/2010 | Kim et al. | |
| 2010/0256288 A1 | 10/2010 | Kim et al. | |
| 2011/0009524 A1 | 1/2011 | Kwon et al. | |
| 2011/0021677 A1 | 1/2011 | Kwon et al. | |
| 2011/0040019 A1 | 2/2011 | Kwon et al. | |
| 2011/0160380 A1 | 6/2011 | Kwon et al. | |
| 2012/0065318 A1 | 3/2012 | Park et al. | |
| 2012/0129989 A1 | 5/2012 | Kim et al. | |
| 2012/0329938 A1 | 12/2012 | Kim et al. | |

FOREIGN PATENT DOCUMENTS

| | | |
|---|---|---|
| DE | 69829099 T2 | 12/2005 |
| EP | 0033393 A2 | 8/1981 |
| EP | 0114288 A2 | 8/1984 |
| EP | 0180417 A2 | 5/1986 |
| EP | 0246620 A2 | 5/1987 |
| EP | 0376616 A2 | 7/1990 |
| EP | 0528462 A1 | 2/1993 |
| EP | 0787769 A2 | 8/1997 |
| EP | 1010725 A2 | 6/2000 |
| EP | 2204412 A1 | 7/2010 |
| JP | 53-134799 A | 11/1978 |
| JP | 57-125241 A | 8/1982 |
| JP | 58-196250 A | 11/1983 |
| JP | 62-268612 A | 11/1987 |
| JP | 04-023856 A | 1/1992 |
| JP | 04-359954 A | 12/1992 |
| JP | 05-098136 A | 4/1993 |
| JP | 05-125260 A | 5/1993 |
| JP | 05-194829 | 8/1993 |
| JP | 06-122771 A | 5/1994 |
| JP | 06-136212 A | 5/1994 |
| JP | 06-313089 A | 11/1994 |
| JP | 07-026101 | 1/1995 |
| JP | 10-060241 A | 3/1998 |
| JP | 10-060242 A | 3/1998 |
| JP | 10-219026 A | 8/1998 |
| JP | 11-129246 A | 5/1999 |
| JP | 11-171984 A | 6/1999 |
| JP | 11-181168 A | 7/1999 |
| JP | 11-279385 | 10/1999 |
| JP | 2000-063641 A | 2/2000 |
| JP | 2000-264959 A | 9/2000 |
| JP | 2000-265001 A | 9/2000 |
| JP | 2000-327992 | 11/2000 |
| JP | 2001-049072 A | 2/2001 |
| JP | 2002-080676 A | 3/2002 |
| JP | 2003-525335 | 8/2003 |
| JP | 2003-313392 | 11/2003 |
| JP | 2005-220173 A | 8/2005 |
| JP | 2006-249292 A | 9/2006 |
| JP | 2006-257284 A | 9/2006 |
| JP | 2006-342246 A | 12/2006 |
| JP | 2007-077222 | 3/2007 |
| JP | 2008-013702 A | 1/2008 |
| JP | 2009-173015 A | 8/2009 |
| JP | 2011-094026 A | 5/2011 |
| KR | 10-1999-0018287 | 3/1993 |
| KR | 1996-0007611 B1 | 6/1996 |
| KR | 10-1998-0004915 | 6/1998 |
| KR | 10-1998-027070 | 7/1998 |
| KR | 1998-055579 | 9/1998 |
| KR | 10-1999-0029495 A | 4/1999 |
| KR | 10-1999-0054644 | 7/1999 |
| KR | 10-2000-0038719 A | 7/2000 |
| KR | 10-2000-0048033 A | 7/2000 |
| KR | 10-2001-0032100 A | 4/2001 |
| KR | 10-2001-0070975 A | 7/2001 |
| KR | 2004-0079118 A | 9/2004 |
| KR | 10-2005-0032100 A | 4/2005 |
| KR | 10-0514272 B | 9/2005 |
| KR | 10-2005-0109049 A | 11/2005 |
| KR | 10-0581437 B | 5/2006 |
| KR | 10-0709878 B1 | 4/2007 |
| KR | 10-2007-0070686 A | 7/2007 |
| KR | 10-2007-0072372 A | 7/2007 |
| KR | 10-0767428 A1 | 10/2007 |
| KR | 10-2008-0062975 A | 7/2008 |
| KR | 10-2008-0063054 A | 7/2008 |
| KR | 10-0871436 B1 | 11/2008 |
| KR | 10-2009-0030511 A | 3/2009 |
| KR | 10-0886348 B1 | 3/2009 |
| KR | 10-2010-0071715 | 6/2010 |
| WO | 02/088044 A1 | 11/2002 |
| WO | 2005/075554 A1 | 8/2005 |
| WO | 2007/119920 A1 | 10/2007 |
| WO | 2007/140101 A1 | 12/2007 |
| WO | 2008/039017 A1 | 4/2008 |
| WO | 2008/081791 A1 | 7/2008 |
| WO | 2009/078593 A1 | 6/2009 |
| WO | 2009/078602 A1 | 6/2009 |
| WO | 2009/113762 A2 | 9/2009 |
| WO | 2009/116722 A1 | 9/2009 |

(56) References Cited

FOREIGN PATENT DOCUMENTS

| WO | 2009/128601 A1 | 10/2009 | |
|---|---|---|---|
| WO | WO 2010143796 * | 12/2010 | ............. C08L 67/00 |
| WO | 2011/013882 A1 | 2/2011 | |
| WO | 2013/100578 A1 | 7/2013 | |

OTHER PUBLICATIONS

International Search Report in commonly owned International Application No. PCT/KR2007/004743, dated Jan. 4, 2008, pp. 1-2.
Office Action in commonly owned U.S. Appl. No. 12/413,630 mailed Jun. 23, 2009, pp. 1-9.
Final Office Action in commonly owened U.S. Appl. No. 12/413,630 mailed Dec. 7, 2009, pp. 1-9.
Advisory Action in commonly owned U.S. Appl. No. 12/413,630 mailed Apr. 9, 2010, pp. 1-3.
French Search Report and Written Opinion in commonly owned French Application No. 0959193 dated May 27, 2010, pp. 1-5.
Office Action in commonly owned U.S. Appl. No. 12/640,343 mailed Aug. 29, 2011, pp. 1-7.
Office Action in commonly owned U.S. Appl. No. 12/640,343 mailed Feb. 22, 2012, pp. 1-13.
Final Office Action in commonly owned U.S. Appl. No. 12/640,343 mailed Jun. 5, 2012, pp. 1-12.
Office Action in commonly owned U.S. Appl. No. 12/641,752 mailed Jan. 10, 2011, pp. 1-10.
Notice of Allowance in commonly owned U.S. Appl. No. 12/641,752 mailed Jul. 20, 2011, pp. 1-9.
International Search Report in commonly owned International Application No. PCT/KR2009/007917 dated Aug. 24, 2010, pp. 1-9.
English-translation of Abstract for Korean Publication No. 1998-055579, published Sep. 25, 1998, pp. 1.
IGRANOX 1076, SpecialChem, Ciba, now part of BASF, 2012 Retrieved online<http://www.specialchem4adhesives.com>, pp. 1.
Office Action in commonly owned U.S. Appl. No. 13/362,068 mailed Apr. 6, 2012, pp. 1-24.
Chinese Search Report in commonly owned Chinese Application No. 200980159831.0 dated Dec. 17, 2012, pp. 1-2.
Office Action in commonly owned U.S. Appl. No. 13/332,736 mailed Sep. 17, 2013, pp. 1-7.
Notice of Allowance in commonly owned U.S. Appl. No. 13/332,736 mailed Apr. 17, 2014, pp. 1-9.
Office Action in commonly owned U.S. Appl. No. 13/300,746 mailed Apr. 9, 2012, pp. 1-19.
Office Action in commonly owned U.S. Appl. No. 13/300,746 mailed Sep. 11, 2012, pp. 1-20.
Final Office Action in commonly owned U.S. Appl. No. 13/300,746 mailed Jan. 3, 2013, pp. 1-14.
Final Office Action in commonly owned U.S. Appl. No. 13/300,746 mailed Jan. 8, 2013, pp. 1-14.
Advisory Action in commonly owned U.S. Appl. No. 13/300,746 mailed Mar. 22, 2013, pp. 1-7.
Office Action in commonly owned U.S. Appl. No. 13/300,746 mailed Jul. 31, 2013, pp. 1-14.
European Search Report in commonly owned European Application No. 08862371 dated Dec. 7, 2010, pp. 1-6.
International Search Report in commonly owned International Application No. PCT/KR2008/006870, dated May 28, 2009, pp. 1-2.
Office Action in commonly owned U.S. Appl. No. 12/631,018 mailed Nov. 8, 2011, pp. 1-10.
Chinese Office Action in commonly owned Chinese Application No. 200910211954 dated Jun. 23, 2011, pp. 1-5.
English translation of Chinese Office Action in commonly owned Chinese Application No. 200910211954 dated Jun. 23, 2011, pp. 1-5.
Katrizky et al., "Correlation and Prediction of the Refractive Indices of Polymers by QSPR", Journal of Chemical Information and Computer Sciences, pp. 1171-1176, (1998).
Office Action in commonly owned U.S. Appl. No. 12/642,904 mailed Dec. 14, 2011, pp. 1-9.
European Search Report in commonly owned European Application No. 09180634 dated Feb. 2, 2010, pp. 1-3.
Xu, "Prediction of Refractive Indices of Linear Polymers by a four-descriptor QSPR model", Polymer, 45 (2004) pp. 8651-8659.
European Search Report in commonly owned European Application No. 10196806 dated Apr. 27, 2011, pp. 1-5.
European Search Report in commonly owned European Application No. 08873425.6 dated May 29, 2012, pp. 1-5.
International Search Report in commonly owned International Application No. PCT/KR2008/007157, dated May 28, 2009, pp. 1-2.
Office Action in commonly owned U.S. Appl. No. 12/792,176 mailed Nov. 16, 2011, pp. 1-12.
International Search Report in commonly owned International Application No. PCT/KR2008/007825, dated Aug. 28, 2009, pp. 1-2.
Office Action in commonly owned U.S. Appl. No. 12/880,209 mailed Feb. 16, 2011, pp. 1-10.
Final Office Action in commonly owned U.S. Appl. No. 12/880,209 mailed Jul. 29, 2011, pp. 1-9.
Advisory Action in commonly owned U.S. Appl. No. 12/880,209 mailed Nov. 4, 2011, pp. 1-4.
International Search Report in commonly owned International Application No. PCT/KR2008/007820 dated Jul. 28, 2009, pp. 1-2.
Final Office Action in commonly owned U.S. Appl. No. 12/792,176 mailed Apr. 19, 2012, pp. 1-10.
International Search Report in commonly owned International Application No. PCT/KR2009/007944 dated Aug. 13, 2010, pp. 1-6.
Full English Translation of JP 04-359953, pp. 1-10.
Full English Translation of JP 04-359954, pp. 1-8.

* cited by examiner

POLYESTER RESIN COMPOSITION HAVING GOOD YELLOWING RESISTANCE AND IMPACT RESISTANCE

CROSS-REFERENCE TO RELATED APPLICATIONS

This application claims priority to and the benefit of International Application No. PCT/KR2012/011485, filed Dec. 26, 2012, which published as WO 2013/100578 on Jul. 4, 2013, and Korean Patent Application No. 10-2011-0144429, filed in the Korean Intellectual Property Office on Dec. 28, 2011; Korean Patent Application No. 10-2011-0144409, filed in the Korean Intellectual Property Office on Dec. 28, 2011; and Korean Patent Application No. 10-2012-0152533, filed in the Korean Intellectual Property Office on Dec. Dec. 24, 2012, the entire disclosure of each of which is incorporated herein by reference.

FIELD OF THE INVENTION

The present invention relates to a polyester resin composition. More particularly, the present invention relates to the polyester resin composition that can have excellent yellowing resistance and impact resistance without deterioration of reflectance and heat resistance of the polyester resin.

BACKGROUND OF THE INVENTION

Recently, polyester resin has been used as a as a material for use in LEDs (light emitting diodes) devices. The polyester has been used in LED components requiring excellent energy efficiency and energy lifespan, such as reflectors, reflector cups, scramblers and LED housings. The polyester used in LED components is high heat resistance modified polyester resin reinforced by glass fiber and including benzene rings in the main chains of the polyester.

Till now, liquid crystal polymer (LCP) which exhibits high heat resistance has been used as reflectors of LED components. However, deterioration and unevenness are generated by using LCP for long period.

Due to solve the problem of LCP, modified polyester resin having high heat resistance is used instead of LCP. Modified polyester resin having high heat resistance should exhibit high heat resistance during the manufacture of a light emitting diode, excellent reflectance with an initial high whiteness index. At the same time, modified polyester resin used in LEDs should exhibit minimal deterioration of whiteness resulting from yellowing. Also, modified polyester resin used in LEDs should exhibit the ability to block the flow of electricity.

LEDs generally include a semiconductor emitting a light, a lead wire, a reflector as a housing, and a transparent sealing product sealing a semiconductor. Among these, the reflector can be made by various materials such as ceramic or heat resistant plastics. Productivity, however, of ceramics can be problematic, and heat resistant plastic can have decreased optical reflectance resulting from a change in color during the injection molding process.

The present invention relates to new modified polyester resin having high heat resistance that can substitute ceramic or heat resistant plastic used in reflectors of LEDs.

PURPOSE OF THE INVENTION

The present invention provides a polyester resin composition that can have excellent yellowing resistance.

The present invention also provides a polyester resin composition that can have good impact resistance.

The present invention further provides a polyester resin composition that can have excellent yellowing resistance and impact resistance without deterioration of reflectance and heat resistance.

These and other objects will be achieved by the present invention as described below.

SUMMARY OF THE INVENTION

The polyester resin composition of the present invention includes (A) 100 parts by weight of high heat resistant polyester resin including a main chain derived from aromatic dicarboxylic acid and cycloaliphatic diol and having a melting point of 200° C. or more; (B) 0.1 to 80 parts by weight of white pigment; and (C) 1 to 40 parts by weight of polyolefin copolymer.

In exemplary embodiments of the invention, the polyester resin composition of the present invention includes (A) 100 parts by weight of high heat resistant polyester resin including a main chain derived from aromatic dicarboxylic acid and cycloaliphatic diol and having a melting point of 200° C. or more; (B) 0.1 to 80 parts by weight of white pigment; (C) 1 to 40 parts by weight of polyolefin copolymer; and (D) 1 to 40 parts by weight of high hardness polyester resin including a main chain derived from aromatic dicarboxylic acid and aliphatic diol.

The high heat resistant polyester resin (A) of the present invention may be polycyclohexanedimethylene terephthalate (PCT) based resin having repeat units represented by Chemical Formula 1:

[Chemical Formula 1]

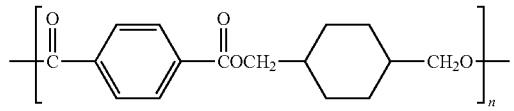

wherein, n is an integer from 50 to 500.

The high heat resistant polyester resin (A) of the present invention may comprise diol components which include 15 to 100 mole % of 1,4-cyclohexanedimethanol and 0 to 85 mole % of ethylene glycol.

The high heat resistant polyester resin (A) of the present invention may comprise diol components further including one or more $C_6$-$C_{21}$ aromatic diols, $C_3$-$C_8$ aliphatic diols, or a combination thereof. The $C_6$-$C_{21}$ aromatic diols or the $C_3$-$C_8$ aliphatic diols may comprise propane-1,3-diol, butane-1,4-diol, pentane-1,5-diol, hexane-1,6-diol, 3-methylpentane-2,4-diol, 2-methylpentane-1,4-diol, 2,2,4-trimethylpentan-1,3-diol, 2-ethylhexane-1,3-diol, 2,2-diethylpropane-1,3-diol, 1,4-cyclobutanedimethanol, 2,2-bis-(hydroxyethoxyphenyl)-propane, 2,2-bis-(4-hydroxypropoxyphenyl)-propane or a combination thereof.

The white pigment (B) of the present invention may comprise titanium oxide, zinc oxide, zinc sulfide, white lead, zinc sulfate, barium sulfate, calcium carbonate, aluminum oxide, or a combination thereof.

The white pigment (B) of the present invention may be titanium dioxide having an average particle diameter of 0.05 to 2.0 μm.

The polyolefin copolymer (C) of the present invention may comprise polyethylene, polypropylene, ethylene-propylene copolymer or a combination thereof as main chain in an amount of 70 to 95% by weight.

The polyolefin copolymer (C) of the present invention may comprise a functional group which has compatibility with the high heat resistant polyester resin (A) as graft copolymerized branch in an amount of 5 to 30% by weight. The functional group which has compatibility with the high heat resistant polyester resin (A) may comprise an acrylate group comprising methylacrylate, ethylacrylate or butylacrylate; a modified ester group; an arylate group; an acrylonitrile group, or a combination thereof.

The high hardness polyester resin (D) may comprise polybutylene terephthalate (PBT) based resin or polyethylene terephthalate (PET) based resin.

The polybutylene terephthalate (PBT) based resin may be polybutylene terephthalate (PBT), copolymer of polybutylene terephthalate (PBT) with polytetramethylene glycol (PTMG), polyethylene glycol (PEG), polypropylene glycol (PPG), aliphatic polyester or aliphatic polyamide; or a combination thereof.

The polyethylene terephthalate (PET) based resin may be polyethylene terephthalate (PET), a copolymer of polyethylene terephthalate (PET) with polytetramethylene glycol (PTMG), polyethylene glycol (PEG), polypropylene glycol (PPG), aliphatic polyester or aliphatic polyamide; or a combination thereof.

The polyethylene terephthalate (PET) based resin may be glycol modified polyethylene terephthalate (PETG) comprising terephthalic acid copolymerized with diol components which include ethylene glycol in amount of more than 50 mole % and 1,4-cyclohexane dimethanol in amount of less than 50 mole %. The polyethylene terephthalate (PET) based resin is not the same as the high heat resistant polyester resin (A).

The polyester resin composition can further comprise (E) 80 or less parts by weight of filler based on 100 parts by weight of the high heat resistant polyester resin (A). The filler (E) may comprise carbon fibers, glass fibers, boron fibers, glass beads, glass flakes, carbon black, diatomaceous earth, clay, kaolin, talc, mica, calcium carbonate, wollastonite, potassium titanate whiskers, aluminum boric acid whiskers, zinc oxide whiskers, calcium whiskers, or a combination thereof. Preferably, an average length of the glass fiber is 0.1 to 20 mm and an aspect ratio (average length of the fiber/average external diameter of the fiber) is 10 to 2,000.

The polyester resin composition can further comprise one or more additives selected from the group consisting of fluorescence brightening agents, lubricants, release agents, nucleating agents, antistatic agents, stabilizers, reinforcement materials, inorganic additives, colorants, and combinations thereof.

The polyester resin composition of the present invention has an initial reflectance measured at a 440 nm wavelength light of 90% or more, a reflectance reduction measured after the specimen is illuminated by a LED light source having a wavelength of 440 nm for 144 hours under constant temperature and humidity conditions, and in particular in an oven at a temperature of 85° C. and relative humidity of 85% less than 10%, The polyester resin composition of the present invention has a change of yellowing index (ΔYI) measured after the specimen is illuminated by a LED light source having a wavelength of 440 nm for 144 hours under constant temperature and humidity conditions, and in particular in an oven at a temperature of 85° C. and relative humidity of 85% of less than 5.

The polyester resin composition of the present invention has an unnotched Izod impact strength of 18 kgf·cm/cm or more measured in accordance with ASTM D256 with a thickness of ⅛".

The present invention provides a molded article prepared from the polyester resin composition of the present invention. Preferably, the molded article may be a reflector for a LED.

EFFECT OF THE INVENTION

The present invention is to provide polyester resin composition that can have excellent reflexibility, heat resistance, impact strength, and yellowing resistance, that can lead to lower decrease in reflectance and lower yellowing after under high temperature/high humidity environment for a long period time.

DETAILED DESCRIPTION OF THE INVENTION

The polyester resin composition of the present invention includes (A) 100 parts by weight of high heat resistant polyester resin including a main chain derived from aromatic dicarboxylic acid and cycloaliphatic diol and having a melting point of 200° C. or more, (B) 0.1 to 80 parts by weight of white pigment, and (C) 1 to 40 parts by weight of polyolefin copolymer.

(A) High Heat Resistant Polyester Resin

The polyester resin composition of the present invention used in an article of reflectors for LEDs should have excellent heat resistance during the manufacture of a light emitting diode.

To impart heat resistance the polyester resin should have a high melting point. But, if the melting point is too high, formability may be deteriorated. In exemplary embodiments the melting point of the high heat resistant polyester resin (A) is 200° C. or more, preferably 220 to 320° C.

The high heat resistant polyester resin (A) has main chain which is derived from aromatic dicarboxylic acid and cycloaliphatic diol. When the polymer includes a cyclic structure in the main chain, the polymer has high melting point.

The dicarboxylic acid of the high heat resistant polyester resin (A) may include an aromatic dicarboxylic acid and derivatives thereof. Examples of the aromatic dicarboxylic acid can include without limitation terephthalic acid, isophthalic acid, naphthalene dicarboxylic acid and the like, and combinations thereof. Examples of the derivatives of the aromatic dicarboxylic acid can include without limitation dimethylterephthalate and the like, and combinations thereof. The diol component of the high heat resistant polyester resin (A) can include a cycloaliphatic diol to form repeat cyclic units. Preferably, 1,4-cyclohexanedimethanol (CHDM) can be used.

The high heat resistant polyester resin (A) can include polycyclohexanedimethylene terephthalate (PCT) based resin having repeat units represented by Chemical Formula 1 prepared by condensation polymerizing terephthalic acid with 1,4-cyclohexanedimethanol.

[Chemical Formula 1]

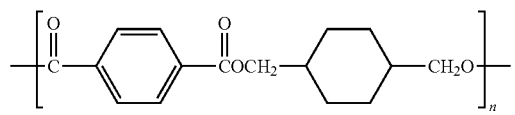

wherein n is an integer from 50 to 500.

The diol component may further include an aliphatic diol such as ethylene glycol (EG) in addition to 1,4-cyclohexanedimethanol. When the diol of the polyester includes both a cycloaliphatic diol such as CHDM and an aliphatic diol such as EG, then the diol can include 15 to 100 mole % of 1,4-cyclohexanedimethanol and 0 to 85 mole % of ethylene glycol, for example 30 to 100 mole % of 1,4-cyclohexanedimethanol and 0 to 70 mole % of ethylene glycol. When ethylene glycol is included as diol component, preferably the high heat resistant polyester resin (A) is glycol modified polycyclohexanedimethylene terephthalate (PCTG) rein or glycol modified polyethylene terephthalate (PETG) resin.

When ethylene glycol is included as diol component, impact resistance of high heat resistant polyester resin (A) is improved. However, if the amount of the ethylene glycol is more than 85 mole %, heat resistance may be deteriorated by reduced copolymerization ratio of 1,4-cyclohexanedimethanol.

The diol component may further include one or more $C_6$-$C_{21}$ aromatic diols, $C_3$-$C_8$ aliphatic diols, or a combination thereof to modify the high heat resistant polyester resin (A). Examples of the $C_6$-$C_{21}$ aromatic diols or $C_3$-$C_8$ aliphatic diols may include without limitation propane-1,3-diol, butane-1,4-diol, pentane-1,5-diol, hexane-1,6-diol, 3-methylpentane-2,4-diol, 2-methylpentane-1,4-diol, 2,2,4-trimethylpentan-1,3-diol, 2-ethylhexane-1,3-diol, 2,2-diethylpropane-1,3-diol, 1,4-cyclobutanedimethanol, 2,2-bis-(hydroxyethoxyphenyl)-propane, 2,2-bis-(4-hydroxypropoxyphenyl)-propane and the like, or a combination thereof.

The intrinsic viscosity of the high heat resistant polyester resin (A) can be 0.4 to 1.5 dl/g, for example 0.5 to 1.1 dl/g, measured in o-chlorophenol solution at 25° C. If the intrinsic viscosity of the high heat resistant polyester resin (A) is less than 0.4 dl/g, mechanical properties may be deteriorated. If the intrinsic viscosity of the high heat resistant polyester resin (A) is greater than 1.5 dl/g, formability may be deteriorated.

The high heat resistant polyester resin (A) can be prepared by conventional condensation polymerization. These methods include condensation polymerizing by transesterification using glycol or low-grade alkylester.

(B) White Pigment

The polyester resin composition of the present invention includes white pigment (B) as an essential element to minimize the change of yellowing and impart good reflectance.

Examples of the white pigment (B) may include without limitation titanium oxide, zinc oxide, zinc sulfide, white lead, zinc sulfate, barium sulfate, calcium carbonate, aluminum oxide and the like. The white pigment (B) may be used alone or in combinations thereof.

Further, the white pigment (B) may be surface treated with a coupling agent, such as a silane coupling agent, titanium coupling agent, and the like, and combinations thereof. Examples of the coupling agent may include without limitation vinyltriethoxysilane, 3-aminopropyltriethoxysilane, 3-glycidoxypropyltriethoxysilane and the like, and combinations thereof.

The white pigment (B) may be titanium dioxide ($TiO_2$), which can improve optical properties such as reflectance and hiding properties. Any conventional titanium dioxide may be used for the present invention. The titanium dioxide is not limited to any particular method of making the same, and conventional preparation methods may be used. Further, the titanium dioxide of the present invention is not limited by particle size. The titanium dioxide can have an average particle diameter of 0.05 to 2.0 µm, for example 0.05 to 0.7 µm.

The titanium dioxide treated by an inorganic or organic surface treatment agent can be used.

Examples of the inorganic surface treatment agent can include without limitation aluminum oxide (alumina, $Al_2O_3$), silicon dioxide (silica, $SiO_2$), zircon dioxide (zirconia, $ZrO_2$), sodium silicate, sodium aluminate, sodium silicate aluminum, zinc oxide, mica and the like. The inorganic surface treatment agent may be used alone or in combinations thereof.

Examples of the organic surface treatment agent can include without limitation polydimethylsiloxane, trimethylpropane (TMP), pentaerythritol and the like. The organic surface treatment agent may be used alone or in combinations thereof.

The titanium dioxide may be coated with about 5 parts by weight or less of the inorganic or organic surface treatment agent, based on 100 parts by weight of titanium dioxide. Preferably, the titanium dioxide may be coated with less than 5 parts by weight of $Al_2O_3$ as an inorganic surface treatment agent, based on 100 parts by weight of titanium dioxide.

In another embodiment of the invention, the titanium dioxide coated by the $Al_2O_3$ can be further coated by another inorganic surface treatment agent such as but not limited to $SiO_2$, $ZrO_2$, sodium silicate, sodium aluminate, sodium silicate aluminum, mica and the like and combinations thereof, and/or an organic surface treatment agent such as but not limited to polydimethylsiloxane, trimethylpropane (TMP), pentaerythritol and the like, and combinations thereof.

The polyester resin composition of the present invention can include the white pigment (B) in an amount of 0.1 to 80 parts by weight, preferably 5 to 70 parts by weight, based on 100 parts by weight of the high heat resistant polyester resin (A). If the polyester resin composition includes the white pigment (B) in an amount less than 0.1 parts by weight, reflectance and yellowing resistance may be deteriorated. If the polyester resin composition includes the white pigment (B) in an amount greater than 80 parts by weight, impact strength resistance may be deteriorated.

(C) Polyolefin Copolymer

The polyester resin composition of the present invention comprises (C) polyolefin copolymer having structure of branched graft copolymer in which polyolefin is main chain and compound including functional group is grafted in the main chain to impart non-yellowing properties and to modify impact resistance. The polyolefin copolymer (C) can be prepared by compound including functional group such as acrylate group, modified ester group, arylate group, acrylonitrile group, or a combination thereof is graft copolymerized on the main chain of the polyolefin.

The polyolefin copolymer (C) may comprise polyethylene, polypropylene, ethylene-propylene copolymer or a combination thereof as main chain in an amount of 70 to 95% by weight.

The compound including functional group may be branch part by graft copolymerizing into the polyolefin, and have compatibility with the high heat resistant polyester resin (A). Preferably, examples of the compound including functional group include without limitation acrylate group such as methylacrylate, ethylacrylate or butylacrylate; modified ester group; arylate group; acrylonitrile group, and the like, or a combination thereof.

The compound including functional group can be used in an amount of 5 to 30% by weight, preferably 7 to 25% by weight. If the amount of the compound including functional group is less than 5% by weight, exfoliation (also delamination or peeling) may occur due to deteriorating miscibility with the high heat resistant polyester resin (A). If the amount of the compound including functional group is more than 30% by weight, impact resistance may be deteriorated due to deteriorating impact modifier.

The polyester resin composition of the present invention can include the polyolefin copolymer (C) in an amount of 1 to 40 parts by weight, preferably 1 to 30 parts by weight, more preferably 1.5 to 20 parts by weight based on 100 parts by weight of the high heat resistant polyester resin (A). If the polyester resin composition includes the polyolefin copolymer (C) in an amount less than 1 parts by weight, improved effect of impact strength resistance and yellowing resistance may be incomplete. If the polyester resin composition includes the polyolefin copolymer (C) in an amount greater than 40 parts by weight, heat resistance may be deteriorated.

In exemplary embodiments of the invention, the polyester resin composition of the present invention includes (A) 100 parts by weight of high heat resistant polyester resin including a main chain derived from aromatic dicarboxylic acid and cycloaliphatic diol and having a melting point of 200° C. or more than, (B) 0.1 to 80 parts by weight of white pigment, (C) 1 to 40 parts by weight of polyolefin copolymer, and (D) 1 to 40 parts by weight of high hardness polyester resin including a main chain derived from aromatic dicarboxylic acid and aliphatic diol.

(D) High Hardness Polyester Resin

The polyester resin composition of the present invention further comprises (D) high hardness polyester resin including a main chain derived from aromatic dicarboxylic acid and aliphatic diol to improve hardness without deterioration of heat resistance.

The high hardness polyester resin (D) comprises polybutylene terephthalate (PBT) based resin or polyethylene terephthalate (PET) based resin.

The polybutylene terephthalate (PBT) based resin can be prepared by esterification or trans esterification of 1,4-butandiol with terephthalic acid or dimethylterephthalate.

The polybutylene terephthalate (PBT) based resin comprises modified polybutylene terephthalate (PBT) with impact-improving ingredient to impart impact resistance. The polybutylene terephthalate (PBT) based resin comprises the modified polybutylene terephthalate (PBT); with polytetramethylene glycol (PTMG), polyethylene glycol (PEG), polypropylene glycol (PPG), low molecular weight aliphatic polyester or low molecular weight aliphatic polyamide; or a combination thereof. The article using the modified polybutylene terephthalate (PBT) with impact-improving ingredient can have improved impact resistance.

The polyethylene terephthalate (PET) based resin can be prepared by condensation polymerization according to esterification or trans-esterification of ethylene glycol with terephthalic acid or dimethylterephthalate.

The polyethylene terephthalate (PET) based resin comprises modified polyethylene terephthalate (PET) with impact-improving ingredient to impart impact resistance. The polyethylene terephthalate (PET) based resin is copolymer of the modified polyethylene terephthalate (PET); with polytetramethylene glycol (PTMG), polypropylene glycol (PPG), low molecular weight aliphatic polyester or low molecular weight aliphatic polyamide; and combination thereof. The article using the modified polyethylene terephthalate (PET) with impact-improving ingredient can have improved impact resistance.

The polyethylene terephthalate (PET) based resin may be glycol modified polyethylene terephthalate (PETG) copolymerized terephthalic acid with diol components which include ethylene glycol in amount of more than 50 mole % and 1,4-cyclohexane dimethanol in amount of less than 50 mole %. The glycol modified polyethylene terephthalate (PETG) is not the same as the high heat resistant polyester resin (A). When the glycol modified polyethylene terephthalate (PETG) is used, impact resistance is improved without deterioration of heat resistance.

The intrinsic viscosity of the high hardness polyester resin (D) can be 0.36 to 1.60 dl/g, preferably 0.52 to 1.25 dl/g, measured in o-chlorophenol solution at 25° C. If the intrinsic viscosity of the high hardness polyester resin (D) is less than 0.36 dl/g, mechanical properties may be deteriorated. If the intrinsic viscosity of the high hardness polyester resin (D) is greater than 1.60 dl/g, formability may be deteriorated.

The polyester resin composition of the present invention can include the high hardness polyester resin (D) in an amount of 1 to 40 parts by weight, based on 100 parts by weight of the high heat resistant polyester resin (A). If the polyester resin composition includes the high hardness polyester resin (D) in an amount less than 1 part by weight, hardness may be deteriorated. If the polyester resin composition includes the high hardness polyester resin (D) in an amount greater than 40 parts by weight, heat resistance may be deteriorated.

(E) Filler

The polyester resin composition of the present invention can include filler (E) that has particles of various forms in order to improve mechanical properties, heat resistance and dimensional stability of the resin composition. The polyester resin composition can include the filler (E) in an amount of less than 80 parts by weight, based on 100 parts by weight of the high heat resistant polyester resin (A). In the range of the amount of the filler (E), mechanical properties, heat resistance and moldability may be improved.

In the present invention, any conventional organic and/or inorganic filler can be used. Exemplary filler includes without limitation carbon fibers, glass fibers, boron fibers, glass beads, glass flakes, carbon black, diatomaceous earth, clay, kaolin, talc, mica, calcium carbonate, or combination thereof. Examples of filler in needle form include without limitation wollastonite, potassium titanate whiskers, aluminum boric acid whiskers, zinc oxide whiskers, calcium whiskers, or a combination thereof.

Filler in the form of needles can be used, which can provide an article with excellent surface smoothness. Also, glass fiber, wollastonite, potassium titanate whiskers and aluminum boric acid whiskers can be used to provide high whiteness.

Preferably among the fillers (E), glass fiber can be used, which can improve moldability, mechanical properties such as and heat resistance, such as tensile strength, flexural strength and flexural modulus, and heat properties, such as heat deflection temperature (HDT).

The average length of the glass fiber can be 0.1 to 20 mm, preferably 0.3 to 10 mm. The aspect ratio (average length of the fiber/average external diameter of the fiber) can be 10 to 2,000, preferably 30 to 1,000. When the glass filler has an aspect ratio in the above range, impact strength can be improved.

The glass fiber can have a circular or round cross section. The present invention, however, is not limited to the use of fibers with round cross sections, and accordingly fibers with other cross sectional shapes can also be used.

(F) Additive

The polyester resin composition of the present invention may further include one or more additives(s) such as but not limited to fluorescence brightening agents, lubricants, release agents, nucleating agents, antistatic agents, stabilizers, reinforcement materials, inorganic additives, colorants such as dyes or pigments, and the like, and combinations thereof.

The fluorescence brightening agents play a role of enhancing light reflectance of polyamide resin composition. Exemplary fluorescence brightening agents include without limitation stilbene-bis benzoxazole derivatives such as 4-(2-benzoxazoleyl)-4'-(5-methyl-2-benzoxazoleyl)stilbene, 4,4'-bis(2-benzoxazoleyl)stilbene, and the like, and combinations thereof.

Exemplary release agents include without limitation polymers containing fluorine, silicon oils, metal salts of stearic acid, metal salts of montanic acid, ester waxes of montanic acid, polyethylene waxes, and the like, and combinations thereof. Exemplary nucleating agents include without limitation talc, clay, and the like, and combinations thereof.

The polyamide resin composition of the present invention has an initial reflectance measured at a 440 nm wavelength light of more than 90%, a reflectance reduction measured after the specimen is illuminated by a LED light source having a wavelength of 440 nm for 144 hours under constant temperature and humidity conditions, and in particular in an oven at a temperature of 85° C. and relative humidity of 85% of less than 10%, and a change of yellowing index ($\Delta YI$) measured after the specimen is illuminated by a LED light source having a wavelength of 440 nm for 144 hours under constant temperature and humidity conditions, and in particular in an oven at a temperature of 85° C. and relative humidity of 85% of less than 5.

The polyester resin composition of the present invention has an unnotched Izod impact strength of 18 kgf·cm/cm or more measured in accordance with ASTM D256 with a thickness of ⅛".

Accordingly, the polyester resin composition of the present invention can be used in articles requiring excellent heat resistance and humidity resistance. The polyester resin composition of the present invention not only can have excellent reflectance and impact strength by including proper amounts of white pigment, but also can have improved heat resistance and humidity resistance. Accordingly, the composition can exhibit only a slight decline in reflectance and change of yellowing after exposure to a constant temperature and constant humidity. Therefore, the polyester resin composition can be used as a LED reflector material which can be continuously exposed to a high temperature environment.

The polyester resin composition of the present invention can be adapted not only for LED applications but also for other applications reflecting light beams. For example, the polyester resin composition can be used in a reflector plate for a light emitting device such as various electric/electronic products, indoor lighting, indicators, outdoor lighting, automobile lighting, displays, and headlights, among others.

The invention may be better understood by reference to the following examples which are intended for the purpose of illustration and are not to be construed as in any way limiting the scope of the present invention, which is defined in the claims appended hereto.

EXAMPLES

The specifications of each component in the following Examples and Comparative Examples are as given below.

(A) High heat resistant polyester resin ($A_1$) Polycyclohexanedimethylene terephthalate (PCT)

Poly(cyclohexanedimethyleneterephthalate) prepared by condensation polymerizing terephthalic acid with 1,4-cyclohexanemethanol is used. The intrinsic viscosity of the PCT resin is 0.6 dl/g and its melting point is 290° C.

($A_2$) Glycol modified polycyclohexanemethylene terephthalate (PCTG)

Glycol modified polycyclohexanemethylene terephthalate (PCTG) prepared by condensation polymerizing terephthalic acid, 1,4-cyclohexanemethanol and ethylene glycol is used. The intrinsic viscosity of the PCTG resin is 0.6 dl/g and its melting point is 270° C.

(A') Liquid crystal polymer (LCP)

A liquid crystal polyester resin with a melting point of 340° C. is used.

(B) White Pigment

Titanium dioxide commercially available as Kronos 2233 with an average particle diameter of 0.25 μm manufactured by Kronos Co., LTD is used.

(C) Polyolefin Copolymer

ELVAFLEX A714 in which main chain is polyethylene and functional group of graft copolymerization is ethylacrylate manufactured by Dupont Company is used.

(D) High Hardness Polyester Resin ($D_1$) Poybutylene Terephthalate (PBT) Polybutylene terephthalate prepared by condensation polymerizing terephthalic acid with 1,4-butandiol is used. The intrinsic viscosity of the PBT is 0.8 dl/g in o-chlorophenol solution, and its melting point is 225° C.

($D_2$) Polyethylene Terephthalate (PET)

Polyethylene terephthalate prepared by condensation polymerizing terephthalic acid with ethylene glycol is used. The intrinsic viscosity of the PET is 0.8 dl/g in o-chlorophenol solution, and its melting point is 260° C.

(D3) Glycol Modified Polyethylene Terephthalate (PETG)

Glycol modified polyethylene terephthalate prepared by condensation polymerizing terephthalic acid with diol component which includes 10 mole % of 1,4-cyclohexanedimethanol and 90 mole % of ethylene glycol is used. The intrinsic viscosity of the PET is 0.8 dl/g in o-chlorophenol solution, and its melting point is 250° C.

(E) Filler

Glass fiber 910 with an aspect ratio of 230 manufactured by Owens Corning Co., LTD. is used.

Physical properties are measured by the following method:

(1) Heat resistance (HDT, ° C.): The heat resistance measured in accordance with ASTM D648 with a thickness of ¼" under a pressure of 1.82 MPa.

(2) Reflectance (%): Initial reflectance (SCI, specular component included) at a wavelength of 440 nm is measured according to CIE Lab color difference evaluation criteria using a Minolta 3600D spectrophotometer, and then is measured again after maintaining the specimen under conditions temperature of 85° C. and 85% relative humidity of 144 hours. The decrease in reflectance is evaluated.

(3) Yellow index (YI): Initial yellow index is measured according to CIE Lab color difference evaluation criteria using a Minolta 3600D spectrophotometer, and then is measured again after maintaining the specimen under conditions of 85° C. and 85% relative humidity for 144 hours. The change of yellow index is evaluated.

(4) Izod Impact strength (unnotched, kgf·cm/cm): The Izod impact strength is measured in accordance with ASTM D256 with a thickness of ⅛".

(5) Flexural modulus (FM, MPa): The flexural modulus is measured in accordance with ASTM D790 with a thickness of ¼".

Examples 1 to 5 and Comparative Examples 1 to 6

The composition in amounts shown in the following Tables 1 are extruded through a conventional extruder heated by 240 to 350° C. and pellets for resin composition are prepared. After drying the prepared pellets at temperature of 120° C. for more than 5 hours, a specimen is prepared using a twin screw extruder heated by 240 to 330° C.

In the following Table 1, the mixture ratio of (A), (B), (C) and (E) are represented based on 100 parts by weight of (A).

TABLE 1

| Component | Examples | | | | | Comparative Examples | | | | | |
|---|---|---|---|---|---|---|---|---|---|---|---|
| | 1 | 2 | 3 | 4 | 5 | 1 | 2 | 3 | 4 | 5 | 6 |
| (A) (A₁) PCT | 100 | 100 | 100 | 100 | — | 100 | 100 | 100 | 100 | 100 | — |
| (A₂) PCTG | — | — | — | — | 100 | — | — | — | — | — | — |
| (A') LCP | — | — | — | — | — | — | — | — | — | — | 100 |
| (B) White Pigment | 20 | 20 | 40 | 40 | 20 | 20 | 20 | — | 90 | — | 40 |
| (C) Polyolefin Copolymer | 10 | 20 | 20 | 20 | 20 | — | 50 | 20 | 20 | — | 20 |
| (E) Filler | 40 | 40 | 40 | 20 | 40 | 40 | 40 | 20 | 40 | 20 | 20 |

(Unit: parts by weight)

Heat resistance, reflectance, yellow index, and impact strength of specimen, which is prepared according to Table 1, are evaluated according to said methods, and the results are recorded in Table 2.

TABLE 2

| | | Examples | | | | | Comparative Examples | | | | | |
|---|---|---|---|---|---|---|---|---|---|---|---|---|
| | | 1 | 2 | 3 | 4 | 5 | 1 | 2 | 3 | 4 | 5 | 6 |
| HDT(° C.) | | 245 | 240 | 242 | 230 | 230 | 260 | 206 | 230 | 232 | 253 | 320 |
| Reflectance (%, SCI) | Before isothermal/isohumidity | 93.2 | 94.3 | 94.7 | 95.2 | 94.5 | 93.7 | 94.4 | 42.3 | 93.6 | 40.6 | 83.3 |
| | After isothermal/isohumidity | 88.1 | 89.1 | 89.9 | 90.0 | 89.2 | 87.1 | 88.3 | 20.3 | 89.4 | 19.8 | 52.6 |
| | Reflectance Reduction | 5.1 | 5.2 | 4.8 | 5.2 | 5.3 | 6.6 | 6.1 | 22.0 | 4.2 | 20.8 | 30.7 |
| Yellow Index (YI) | Before isothermal/isohumidity | 2.4 | 2.4 | 2.2 | 2.0 | 2.5 | 2.4 | 2.4 | 15.2 | 2.2 | 16.3 | 8.9 |
| | After isothermal/isohumidity | 5.8 | 5.4 | 5.0 | 4.9 | 5.6 | 6.0 | 5.3 | 28.3 | 5.0 | 29.1 | 28.4 |
| | ΔYI | 3.4 | 3.0 | 2.8 | 2.9 | 3.1 | 3.6 | 2.9 | 13.1 | 2.8 | 12.8 | 19.5 |
| Izod Impact Strength (kgf · cm/cm) | | 23.6 | 25.4 | 22.3 | 22.7 | 21.4 | 14.7 | 27.3 | 26.6 | 11.8 | 15.8 | 14.3 |

As shown in Table 2, the polyester resin compositions of Examples 1 to 5 have excellent yellowing resistance and impact resistance without deterioration of heat resistance and reflexibility.

On the other hand, Comparative Example 1 without polyolefin copolymer (C), impact resistance is deteriorated. Comparative Example 3 without white pigment (B), reflectance and non-yellowing properties are deteriorated. Comparative Example 2 which uses polyolefin copolymer (C) beyond the range of an amount of the present invention, heat resistance is deteriorated. Further, Comparative Example 4 which uses white pigment (B) beyond the range of an amount of the present invention, impact resistance is deteriorated. And, Comparative Example 5 without both white pigment (B) and polyolefin copolymer (C), reflectance, non-yellowing properties and impact resistance are deteriorated. Comparative Example 6 which uses liquid crystal polymer (A'), reflectance, non-yellowing properties and impact resistance are deteriorated.

Examples 6 to 12 and Comparative Examples 7 to 11

The composition in amounts shown in the following Tables 3 are extruded through a conventional extruder heated by 240 to 350° C. and pellets for resin composition are prepared. After drying the prepared pellets at temperature of 120° C. for 5 hours or more, a specimen is prepared using a twin screw extruder heated by 240 to 330° C.

In the following Table 3, the mixture ratio of (A), (A'), (B), (C), (D) and (E) are represented based on 100 parts by weight of (A).

TABLE 3

| Component | | Examples | | | | | | | Comparative Examples | | | | |
|---|---|---|---|---|---|---|---|---|---|---|---|---|---|
| | | 6 | 7 | 8 | 9 | 10 | 11 | 12 | 7 | 8 | 9 | 10 | 11 |
| (A) | ($A_1$) PCT | 100 | 100 | 100 | 100 | 100 | 100 | — | 100 | 100 | 100 | 100 | — |
| | ($A_2$) PCTG | — | — | — | — | — | — | 100 | — | — | — | — | — |
| (A') LCP | | — | — | — | — | — | — | — | — | — | — | — | 100 |
| (B) White Pigment | | 20 | 20 | 40 | 40 | 40 | 40 | 40 | 40 | 40 | — | — | 40 |
| (C) Polyolefin Copolymer | | 10 | 20 | 20 | 20 | 20 | 20 | 20 | 20 | 20 | 20 | — | 20 |
| (D) | ($D_1$) PBT | 10 | 20 | 20 | 20 | — | — | 20 | — | 60 | 20 | — | 20 |
| | ($D_2$) PET | — | — | — | — | 20 | — | — | — | — | — | — | — |
| | ($D_3$) PETG | — | — | — | — | — | 20 | — | — | — | — | — | — |
| (E) Filler | | 40 | 40 | 40 | 20 | 40 | 40 | 40 | 40 | 40 | 40 | 20 | 40 |

(Unit: parts by weight)

Heat resistance, reflectance, yellow index, impact strength and flexural modulus of specimen, which is prepared according to Table 3, are evaluated according to said methods, and the results are recorded in Table 4.

TABLE 4

| | | Examples | | | | | | | Comparative Examples | | | | |
|---|---|---|---|---|---|---|---|---|---|---|---|---|---|
| | | 6 | 7 | 8 | 9 | 10 | 11 | 12 | 7 | 8 | 9 | 10 | 11 |
| HDT(° C.) | | 248 | 242 | 246 | 233 | 247 | 243 | 237 | 242 | 250 | 232 | 253 | 323 |
| Reflectance (%, SCI) | Before isothermal/isohumidity | 93.0 | 94.5 | 94.9 | 95.1 | 94.8 | 94.7 | 95.0 | 94.7 | 95.0 | 42.0 | 40.6 | 83.5 |
| | After isothermal/isohumidity | 87.7 | 89.1 | 89.8 | 89.9 | 89.8 | 89.5 | 89.7 | 89.9 | 89.8 | 19.7 | 19.8 | 53.0 |
| | Reflectance Reduction | 5.3 | 5.4 | 5.1 | 5.2 | 5.0 | 5.2 | 5.3 | 4.8 | 5.2 | 22.3 | 20.8 | 30.5 |
| Yellow Index (YI) | Before isothermal/isohumidity | 2.5 | 2.7 | 2.3 | 2.1 | 2.2 | 2.3 | 2.5 | 2.2 | 2.4 | 15.4 | 16.3 | 8.4 |
| | After isothermal/isohumidity | 5.8 | 5.9 | 5.2 | 5.1 | 5.3 | 5.3 | 5.6 | 5.0 | 5.4 | 28.6 | 29.1 | 27.4 |
| | ΔYI | 3.3 | 3.2 | 2.9 | 3.0 | 3.1 | 3.0 | 3.1 | 2.8 | 3.0 | 13.2 | 12.8 | 19.0 |
| Izod Impact Strength (kgf · cm/cm) | | 22.0 | 23.1 | 20.9 | 23.7 | 20.6 | 22.0 | 20.1 | 22.3 | 16.9 | 25.1 | 15.8 | 12.1 |
| Flexural Modulus (MPa) | | 7300 | 7200 | 7250 | 7070 | 7280 | 7200 | 7170 | 6900 | 7500 | 7000 | 6850 | 8600 |

As shown Table 4, the polyester resin compositions of Examples 6 to 12 do not have deteriorated heat resistance, reflectance, non-yellowing properties and impact resistance and also have hardness.

On the other hand, Comparative Example 7 without high stiffness polyester resin (D) has good heat resistance, reflexibility, yellowing resistance, and impact resistance, but has deteriorated stiffness. Comparative Example 9 without white pigment (B) has deteriorated reflexibility and yellowing resistance. Comparative Example 8 using high stiffness polyester resin (D) with the content beyond the present invention has deteriorated impact resistance. Comparative Example 10 without stiffness polyester resin (D), white pigment (B) and polyolefin copolymer (C) has deteriorated reflexibility, yellowing resistance, impact resistance, and stiffness. Comparative Example 11 which uses liquid crystal polyester resin (A'), reflectance and non-yellowing properties are deteriorated since difference in reflectance and yellow index are increased.

Many modifications and other embodiments of the invention will come to mind to one skilled in the art, and that modifications and other embodiments are intended to be included within the scope of the appended claims.

That which is claimed is:
1. A polyester resin composition comprising:
(A) 100 parts by weight of polyester resin, wherein the polyester resin is an ethylene glycol modified polycyclohexanedimethylene terephthalate based resin including a main chain derived from terephthalic acid and a diol component including 15 to less than 100 mol % of 1,4-cyclohexanedimethanol and greater than 0 to 85 mol % of ethylene glycol and having a melting point of 200° C. or more;
(B) 0.1 to 80 parts by weight of white pigment; and
(C) 1 to 40 parts by weight of polyolefin copolymer,
wherein the ethylene glycol modified polycyclohexanedimethylene terephthalate based resin (A) includes repeat units from ethylene glycol and repeat units represented by Chemical Formula 1:

[Chemical Formula 1]

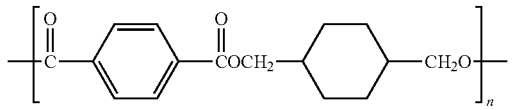

wherein n is an integer from 50 to 500.
2. The polyester resin composition of claim 1, wherein the diol component of the polyester resin (A) further comprises one or more $C_6$-$C_{21}$ aromatic diols, $C_3$-$C_8$ aliphatic diols, or a combination thereof.
3. The polyester resin composition of claim 2, wherein the $C_6$-$C_{21}$ aromatic diols or the $C_3$-$C_8$ aliphatic diols comprise propane-1,3-diol, butane-1,4-diol, pentane-1,5-diol, hexane-1,6-diol, 3-methylpentane-2,4-diol, 2-methylpentane-1,4-diol, 2,2,4-trimethylpentan-1,3-diol, 2-ethylhexane-1,3-diol, 2,2-diethylpropane-1,3-diol, 1,4-cyclobutanedimethanol, 2,2-bis-(hydroxyethoxyphenyl)-propane, 2,2-bis-(4-hydroxypropoxyphenyl)-propane or a combination thereof.
4. The polyester resin composition of claim 1, wherein the white pigment (B) comprises titanium oxide, zinc oxide, zinc sulfide, white lead, zinc sulfate, barium sulfate, calcium carbonate, aluminum oxide, or a combination thereof.
5. The polyester resin composition of claim 1, wherein the white pigment (B) is titanium dioxide having an average particle diameter of 0.05 to 2.0 µm.
6. The polyester resin composition of claim 1, wherein the polyolefin copolymer (C) comprises polyethylene, polypropylene, ethylene-propylene copolymer or a combination thereof as main chain in an amount of 70 to 95% by weight.
7. The polyester resin composition of claim 1, wherein the polyester resin composition further comprises one or more additives selected from the group consisting of fluorescence brightening agents, lubricants, release agents, nucleating agents, antistatic agents, stabilizers, reinforcement materials, inorganic additives, colorants, and combinations thereof.
8. The polyester resin composition of claim 1, wherein the polyester resin composition has an initial reflectance measured at a 440 nm wavelength light of 90% or more, a reflectance reduction measured after the specimen is illuminated by a LED light source having a wavelength of 440 nm for 144 hours at a temperature of 85° C. and relative humidity of 85% of less than 10%, and a change of yellowing index (ΔYI) measured after the specimen is illuminated by a LED light source having a wavelength of 440 nm for 144 hours at a temperature of 85° C. and relative humidity of 85% of less than 5.
9. The polyester resin composition of claim 1, wherein the polyester resin composition has an Izod impact strength of 18 kgfcm/cm or more measured in accordance with ASTM D256 with a thickness of ⅛".
10. The polyester resin composition of claim 1, wherein the polyolefin copolymer (C) comprises a functional group which has compatibility with resistant polyester resin (A) as a graft copolymerized branch in an amount of 5 to 30% by weight.
11. The polyester resin composition of claim 10, wherein the functional group which has compatibility with the polyester resin (A) comprises an acrylate group comprising methylacrylate, ethylacrylate or butylacrylate, a modified ester group, an arylate group, an acrylonitrile group, or a combination thereof.
12. The polyester resin composition of claim 1, wherein the polyester resin composition further comprises 80 parts by weight or less of a filler (E) based on 100 parts by weight of the polyester resin (A).
13. The polyester resin composition of claim 12, wherein the filler (E) comprises carbon fibers, glass fibers, boron fibers, glass beads, glass flakes, carbon black, diatomaceous earth, clay, kaolin, talc, mica, calcium carbonate, wollastonite, potassium titanate whiskers, aluminum boric acid whiskers, zinc oxide whiskers, calcium whiskers, or a combination thereof.
14. The polyester resin composition of claim 13, wherein the glass fibers have an average length of 0.1 to 20 mm, and an aspect ratio of 10 to 2,000.
15. The polyester resin composition of claim 1, further comprising (D) 1 to 40 parts by weight of polyester resin including a main chain derived from aromatic dicarboxylic acid and aliphatic diol based on 100 parts by weight of the polyester resin (A).
16. The polyester resin composition of claim 15, wherein the polyester resin (D) comprises polybutylene terephthalate based resin or polyethylene terephthalate based resin.
17. The polyester resin composition of claim 16, wherein the polyethylene terephthalate based resin is polyethylene terephthalate, a copolymer of polyethylene terephthalate with polytetramethylene glycol, polypropylene glycol, aliphatic polyester, aliphatic polyamide, or a combination thereof.

18. The polyester resin composition of claim 16, wherein the polybutylene terephthalate based resin is polybutylene terephthalate, a copolymer of polybutylene terephthalate with polytetramethylene glycol, polyethylene glycol, polypropylene glycol, aliphatic polyester, aliphatic polyamide, or a combination thereof.

19. The polyester resin composition of claim 16, wherein the polyethylene terephthalate based resin is glycol modified polyethylene terephthalate comprising terephthalic acid copolymerized with diol components which include ethylene glycol in amount of more than 50 mole % and 1,4-cyclohexane dimethanol in amount of less than 50 mole %, wherein the polyethylene terephthalate based resin is not the same as the polyester resin (A).

20. A molded article prepared from the polyester resin composition of claim 1.

21. The molded article of claim 20, wherein the molded article is a reflector for a LED.

* * * * *